(12) United States Patent
Verma et al.

(10) Patent No.: US 10,347,712 B1
(45) Date of Patent: Jul. 9, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Purakh Raj Verma, Singapore (SG); Chia-Huei Lin, New Taipei (TW); Kuo-Yuh Yang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/893,715

(22) Filed: Feb. 12, 2018

(30) Foreign Application Priority Data

Jan. 9, 2018 (CN) .......................... 2018 1 0018793

(51) Int. Cl.
*H01L 29/06* (2006.01)
*H01L 21/762* (2006.01)
*H01L 23/522* (2006.01)
*H01L 21/763* (2006.01)

(52) U.S. Cl.
CPC ........ *H01L 29/0607* (2013.01); *H01L 21/762* (2013.01); *H01L 21/763* (2013.01); *H01L 23/5225* (2013.01)

(58) Field of Classification Search
CPC . H01L 29/0607; H01L 21/762; H01L 21/763; H01L 23/5225
See application file for complete search history.

(56) References Cited

U.S. PATENT DOCUMENTS

| 5,654,216 A * | 8/1997 | Adrian ............. H01L 21/32136 257/E21.311 |
| 6,743,669 B1 * | 6/2004 | Lin ................. H01L 21/823481 257/E21.268 |
| 8,722,508 B2 | 5/2014 | Botula et al. |
| 8,841,183 B2 * | 9/2014 | Ozawa ............. H01L 21/28282 257/E21.21 |
| 9,012,996 B2 | 4/2015 | Zhong et al. |
| 9,312,185 B2 * | 4/2016 | Tran ........................ H01L 28/20 |
| 9,514,987 B1 | 12/2016 | Gambino et al. |
| 2005/0082639 A1 * | 4/2005 | Kikuta ................ H01L 27/0629 257/533 |
| 2008/0057612 A1 * | 3/2008 | Doan ................ H01L 21/76237 438/57 |
| 2013/0178031 A1 * | 7/2013 | Ramkumar ..... H01L 21/823412 438/287 |
| 2014/0264624 A1 * | 9/2014 | Yen ........................ H01L 28/20 257/379 |
| 2014/0291767 A1 * | 10/2014 | Lee .................... H01L 21/76229 257/368 |

(Continued)

*Primary Examiner* — Christine A Enad
(74) *Attorney, Agent, or Firm* — Winston Hsu

(57) ABSTRACT

A method for fabricating semiconductor device includes: forming a metal-oxide semiconductor (MOS) transistor on a substrate; forming a first interlayer dielectric (ILD) layer on the MOS transistor; removing part of the first ILD layer to form a trench adjacent to the MOS transistor; forming a trap rich structure in the trench; forming a second ILD layer on the MOS transistor and the trap rich structure; forming a contact plug in the first ILD layer and the second ILD layer and electrically connected to the MOS transistor; and forming a metal interconnection on the second ILD layer and electrically connected to the contact plug.

16 Claims, 3 Drawing Sheets

(56) References Cited

U.S. PATENT DOCUMENTS

2015/0061147 A1* 3/2015 Lin .................. H01L 23/53238
 257/774
2017/0047286 A1* 2/2017 Basker ............. H01L 21/31051
2017/0092693 A1* 3/2017 Tan ....................... H01L 27/228

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming trap rich structure adjacent to metal-oxide semiconductor (MOS) transistor.

2. Description of the Prior Art

In radio frequency (RF) integrated circuit application, such as RF switch device or power amplifier device, performance is suffered from "parasitic surface charge" issue, which in turn generates harmonic effect. There are several wafer process technologies available for solving the issue such as using semiconductor-on-insulator (SOI) wafer to isolate the charges from the high resistivity wafer substrate. However, as the RF switch goes high frequency, it is more sensitive to RF harmonic effect induced by the parasitic surface charges hence how to resolve this problem and improve the performance of the device has become an important task in this field.

SUMMARY OF THE INVENTION

According to an embodiment of the present invention, a method for fabricating semiconductor device includes: forming a metal-oxide semiconductor (MOS) transistor on a substrate; forming a first interlayer dielectric (ILD) layer on the MOS transistor; removing part of the first ILD layer to form a trench adjacent to the MOS transistor; forming a trap rich structure in the trench; forming a second ILD layer on the MOS transistor and the trap rich structure; forming a contact plug in the first ILD layer and the second ILD layer and electrically connected to the MOS transistor; and forming a metal interconnection on the second ILD layer and electrically connected to the contact plug.

According to another aspect of the present invention, a semiconductor device includes: a metal-oxide semiconductor (MOS) transistor on a substrate; a trap rich structure on the substrate and adjacent to the MOS transistor, wherein a bottom surface of the trap rich structure is even with a top surface of the substrate; and an interlayer dielectric (ILD) layer on the MOS transistor and the trap rich structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
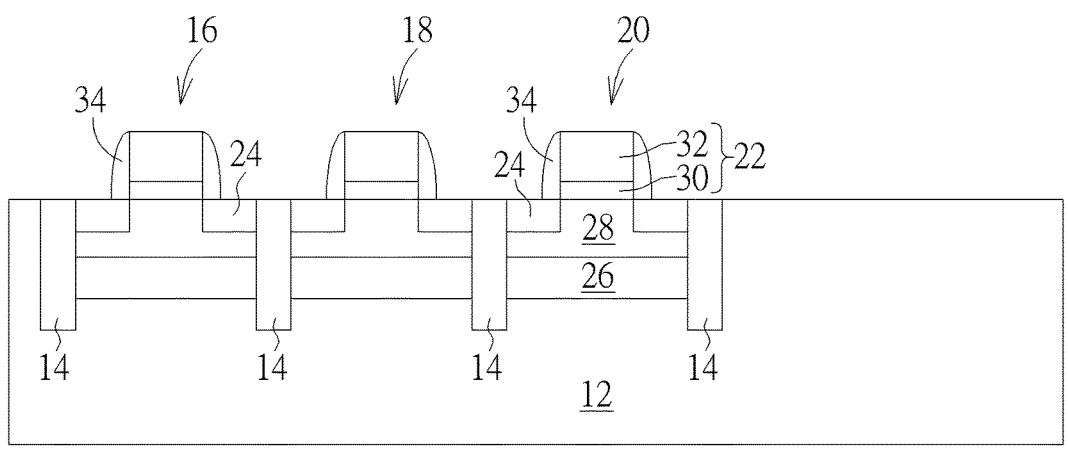
FIGS. 1-3 illustrate a method for fabricating semiconductor device according to an embodiment of the present invention.
Figure 2:
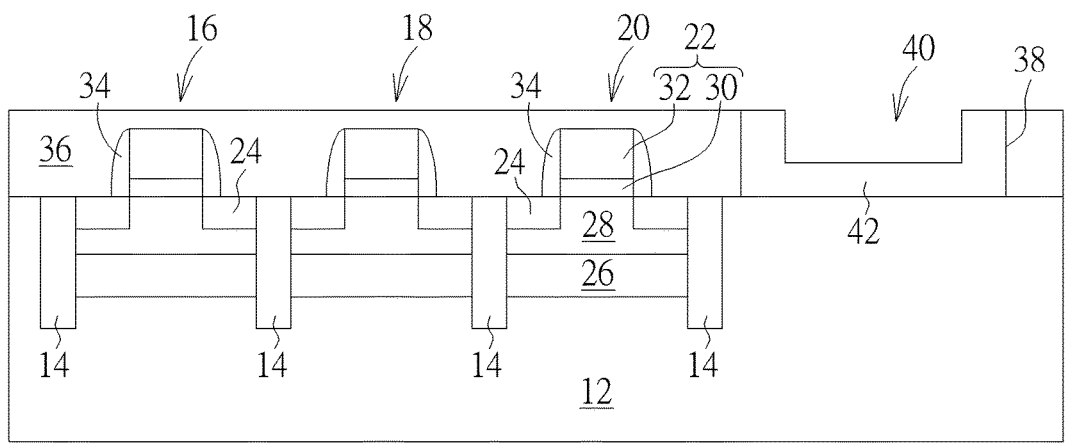
Figure 3:
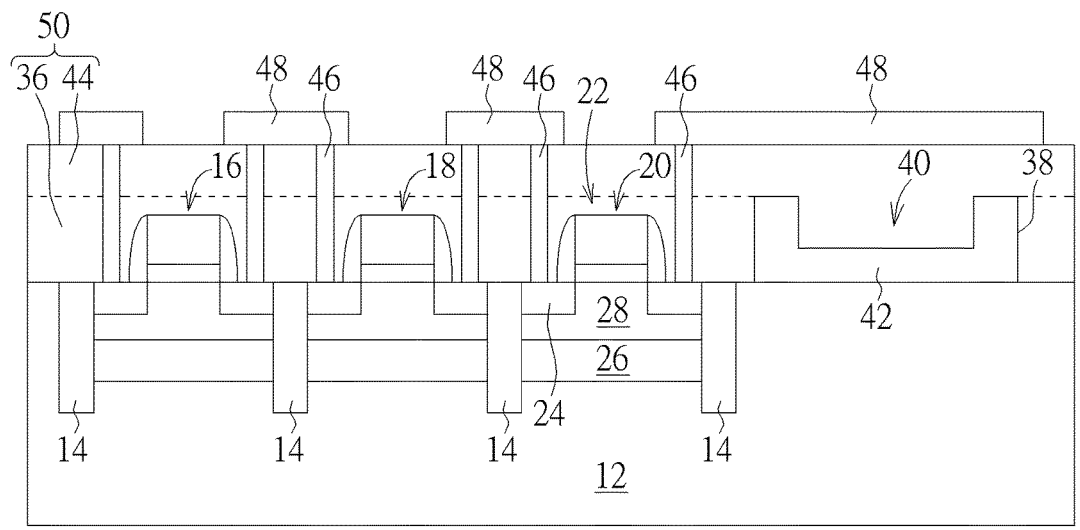

Referring to FIGS. 1-3, FIGS. 1-3 illustrate a method for fabricating semiconductor device according to an embodiment of the present invention. As shown in FIG. 1, a substrate 12 such as a semiconductor substrate having high resistance or more specifically a silicon substrate having high resistance is first provided, a plurality of isolation structures such as deep trench isolation structures 14 preferably made of silicon oxide are formed in the substrate 12, and MOS transistors such as MOS transistors 16, 18, 20 are formed on the substrate 12 between the deep trench isolation structures 14. It should be noted that even though three MOS transistors 16, 18, 20 having same conductive type are disposed on the substrate 12 in this embodiment, the number and conductive type of the MOS transistors 16, 18, 20 could all be adjusted depending on the demand of the process or product.

In this embodiment, the formation of the MOS transistors 16, 18, 20 could be accomplished by first forming a deep well and a well region in the substrate 12, and then forming transistor elements such as but not limited to for example gate structures 22 and source/drain regions 24 on the substrate 12. Preferably, the conductive type of the deep well and the well region could be adjusted depending on the type of device being fabricated. For instance, the deep well in this embodiment preferably includes a deep n-well 26 while the well region preferably includes a p-well 28, but not limited thereto.

In this embodiment, the formation of the gate structures 22 could be accomplished by a gate first process, a high-k first approach from gate last process, or a high-k last approach from gate last process. Since this embodiment pertains to a gate first approach, a gate dielectric layer 30 or interfacial layer, a gate material layer 32 made of polysilicon, and a selective hard mask could be formed sequentially on the substrate 12, and a photo-etching process is then conducted by using a patterned resist (not shown) as mask to remove part of the gate material layer 32 and part of the gate dielectric layer 30 through single or multiple etching processes. After stripping the patterned resist, gate structures 22 each composed of a patterned gate dielectric layer 30 and a patterned material layer 32 are formed on the substrate 12.

Next, at least a spacer 34 is formed on the sidewalls of the each of the gate structures 22, a source/drain region 24 and/or epitaxial layer is formed in the substrate 12 adjacent to two sides of the spacer 34, and selective silicide layers (not shown) could be formed on the surface of the source/drain regions 24. In this embodiment, the spacer 34 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 24 could include n-type dopants or p-type dopants depending on the type of device being fabricated. For instance, the source/drain region 24 preferably includes n-type dopants in this embodiment, but not limited thereto.

Next, as shown in FIG. 2, a selective contact etch stop layer (CESL) (not shown) could be formed on the gate structures 22 to cover the gate structures 22, and a first interlayer dielectric (ILD) layer 36 is formed on the CESL. Next, a pattern transfer process is conducted by using patterned mask (not shown) as mask to remove part of the first ILD layer 36 adjacent to the MOS transistor 20 for forming trench 38 exposing the surface of the substrate 12, and then forming a trap rich structures 40 in the trench 38.

In this embodiment, the formation of the trap rich structure 40 could be accomplished by first conducting a deposition such as chemical vapor deposition (CVD) process to form a dielectric layer 42 in the trench 38 and on the surface of the first ILD layer 36. Specifically, the dielectric layer 42 is deposited to cover the top surface of the first ILD layer 36, sidewalls of the first ILD layer 36 within the trench 38, and the top surface of the substrate 12 in the bottom of the trench 38 without filling the trench 38 completely. Next, a planarizing process such as chemical mechanical polishing (CMP) process is conducted to remove part of the part of the dielectric layer 42 on the top surface of the first ILD layer 36 so that the top surface of the remaining dielectric layer 42 is even with the top surface of the first ILD layer 36, in which a cross-section of the remaining dielectric layer 42 includes a U-shaped profile. In this embodiment, the dielectric layer 42 preferably includes doped polysilicon or silicon nitride, but not limited thereto.

It should be noted that even though the bottom of the U-shaped trap rich structure 40 is even with the surface of the substrate 12 or the bottom of the gate structure 22, it would also be desirable to adjust the depth of the trench 38 so that the bottom surface of the trench 38 could be slightly higher than the surface of the substrate 12 or lower than the surface of the substrate 12, and the dielectric layer 42 is deposited in the trench 38 thereafter to form the trap rich structure 40. In other word, the bottom surface of the U-shaped trap rich structure 40 could be slightly higher than the bottom surface of the adjacent gate structure 22 while the top surface of the trap rich structure 40 is even with the top surface of the first ILD layer 36, or the bottom surface of the trap rich structure 40 could be slightly lower than the bottom surface of the gate structure 22 while the top surface of the trap rich structure 40 is even with the top surface of the first ILD layer 36, which are all within the scope of the present invention.

Next, as shown in FIG. 3, a second ILD layer 44 is formed on the first ILD layer 36 and covering the MOS transistors 16, 18, 20, and the trap rich structure 40, and contact plugs 46 are formed in the first ILD layer 36 and the second ILD layer 44 to electrically connect the MOS transistors, 16, 18, 20.

In this embodiment, the first ILD layer 36 and the second ILD layer 44 preferably include same material, such as both being made of dielectric material including but not limited to for example silicon oxide. Next, the formation of the contact plugs 46 could be accomplished by first conducting a patterned transfer or photo-etching process by using a patterned mask (not shown) as mask to remove part of the second ILD layer 44 and part of the first ILD layer 36 adjacent to the gate structures 22 for forming contact holes (not shown) exposing the source/drain regions 24 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 46 electrically connecting the source/drain regions 24.

Next, a metal interconnective process is conducted to form inter-metal dielectric (IMD) layer (not shown) on the second ILD layer 44 and metal interconnections 48 connected to each of the contact plugs 46. This completes the fabrication of a semiconductor device according to a preferred embodiment of the present invention.

Referring again to FIG. 3, FIG. 3 further discloses a structural view of a semiconductor device according to an embodiment of the present invention. As shown in FIG. 3, the semiconductor device includes at least a MOS transistor such as MOS transistors 16, 18, 20 on the substrate 12, a trap rich structure 40 disposed on the substrate 12 and adjacent to the MOS transistors 16, 18, 20, and an ILD layer 50 disposed on the MOS transistors 16, 18, 20 and the trap rich structure 40.

In this embodiment, the ILD layer 50 further includes a first ILD layer 36 covering the MOS transistors 16, 18, 20 and a second ILD layer 44 disposed on the first ILD layer 36 while covering the MOS transistors 16, 18, 20 and the trap rich structure 40 at the same time. Preferably, the bottom surface of the trap rich structure 40 is even with the top surface of the substrate 12, the trap rich structure 40 includes a U-shaped cross-section, the top surface of the trap rich structure 40 is even with the top surface of the first ILD layer 36, and the trap rich structure 40 is preferably made of dielectric material including but not limited to for example undoped polysilicon or silicon nitride.

The semiconductor device further includes contact plug 46 disposed in the first ILD layer 36 and the second ILD 44 and electrically connected to the source/drain regions 24 of the MOS transistors 16, 18, 20 and metal interconnections 48 disposed on the second ILD layer 44 and electrically connected to the contact plugs 46. In this embodiment, at least one of the metal interconnection 48 is disposed directly on top of the trap rich structure 40 to cover or shield the trap rich structure 40 completely, in which the presence of the trap rich structure 40 could be used to shield noises generated between the metal interconnections 48 and the substrate 12 or other devices thereby improving the performance of the device.

Figure 4:
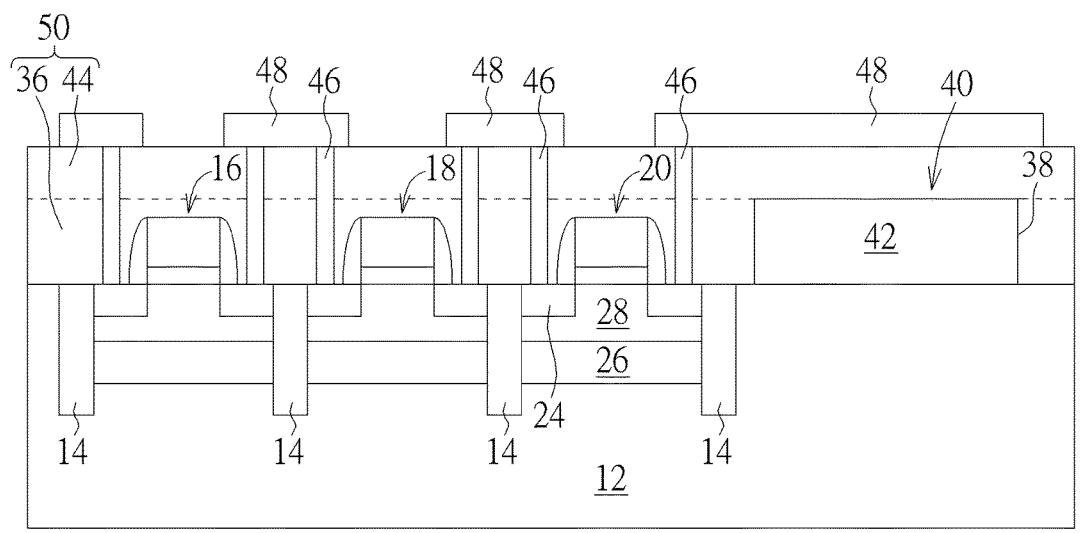
FIG. 4 illustrates a structural view of a semiconductor device according to an embodiment of the present invention.

Referring to FIG. 4, FIG. 4 illustrates a structural view of a semiconductor device according to an embodiment of the present invention. As shown in FIG. 4, in contrast to the trap rich structure 40 having U-shaped cross-section as disclosed in the aforementioned embodiment, it would also be desirable to control the amount of dielectric layer 42 deposited into the trench 38 such as by filling the trench 38 with the dielectric layer 42 completely, and then conducting a planarizing process such as CMP to remove part of the dielectric layer 42 for forming a trap rich structure 40, in which the top surface of the trap rich structure 40 or the remaining dielectric layer 42 is even with the top surface of the first ILD layer 36. In this embodiment, the trap rich structure 40 preferably includes a rectangular cross-section, which is also within the scope of the present invention.

Figure 5:
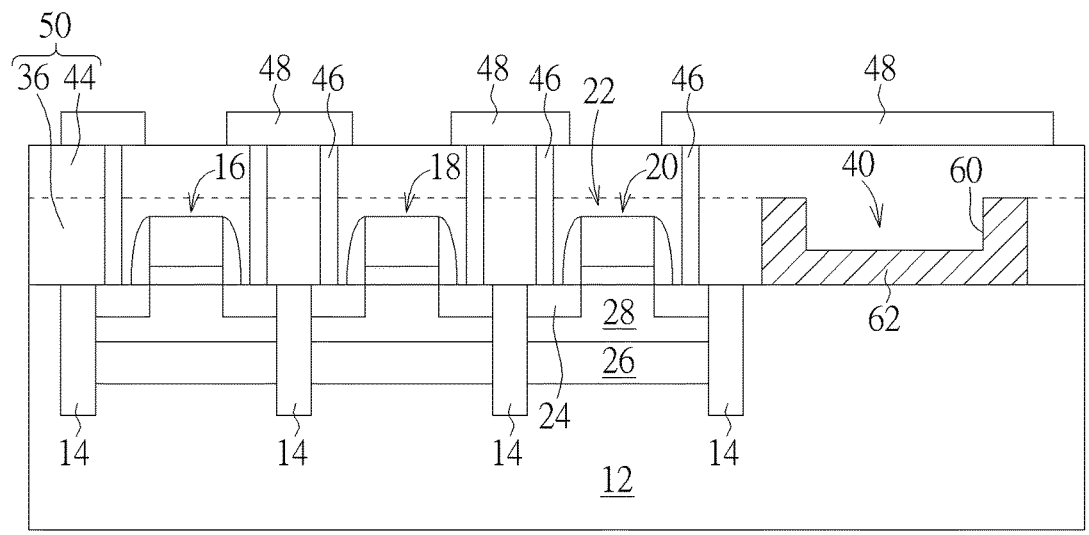
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, the formation of the trap rich structure 40 could also be accomplished by first forming a trench 60 in the first ILD layer 36 and then conducting an ion implantation process to implant non-conductive ions including but not limited to for example silicon, germanium, carbon, nitrogen, or combination thereof into the first ILD layer 36 around the trench 60 to form a doped region 62 or a trap rich structure 40 made of the doped region 62. In other words, instead of using the inner portion of the trench 38 to form a trap rich structure 40 made of dielectric material as disclosed in the aforementioned embodiment, the present embodiment conducts an ion implantation process to form a doped region 62 outside the trench 60 to forma trap rich structure 40 made of the doped region 62. Similar to the aforementioned embodiment, it would also be desirable to adjust the depth of the trench 60 so that the bottom surface of the U-shaped trap rich structure 40 made of doped region 62 could be slightly higher than the bottom surface of the adjacent gate structure 22 while the top surface of the trap rich structure 40 is even with the top surface of the first ILD layer 36, or the bottom surface of the trap rich structure 40 is slightly lower than the bottom surface of the gate structure 22 while the top surface of the trap rich structures is even with the top surface of the first ILD layer 36, which are all within the scope of the present invention.

Figure 6:
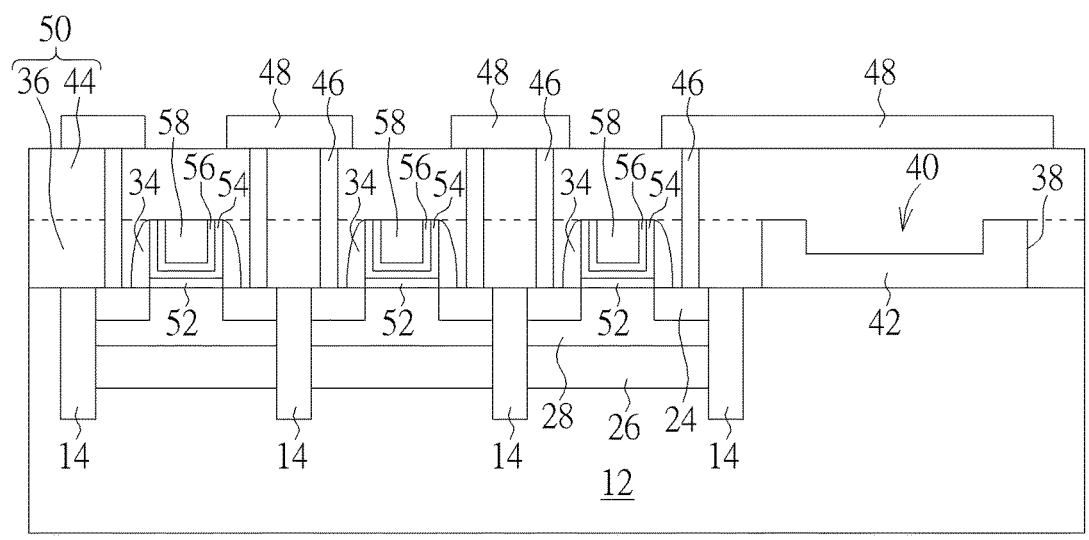
FIG. 6 illustrates a structural view of a semiconductor device according to an embodiment of the present invention.

Referring to FIG. 6, FIG. 6 illustrates a method of transforming the gate structure 22 made of polysilicon from the aforementioned embodiment into a metal gate according to a high-k last process. As shown in FIG. 6, after the first ILD layer 36 is formed, a planarizing process such as CMP could be conducted to remove part of the first ILD layer 36 to expose the top surface of the gate material layer 32 made of polysilicon layer so that the top surface of the gate material layer 32 is even with the top surface of the first ILD layer 36.

Next, a replacement metal gate (RMG) process is conducted to transform the gate structures 22 of the MOS transistors 16, 18, 20 into metal gates. For instance, the RMG process could be accomplished by first performing a selective dry etching or wet etching process using etchants including but not limited to for example ammonium hydroxide (NH$_4$OH) or tetramethylammonium hydroxide (TMAH) to remove the gate material layer 32 and even gate dielectric layer 30 from each of the gate structures 22 for forming recesses (not shown) in the first ILD layer 36.

Next, a selective interfacial layer 52 or gate dielectric layer (not shown), a high-k dielectric layer 54, a work function metal layer 56, and a low resistance metal layer 58 are formed in the recesses, and a planarizing process such as CMP is conducted to remove part of low resistance metal layer 58, part of work function metal layer 56, and part of high-k dielectric layer 54 to form metal gates. In this embodiment, each of the gate structures or metal gates fabricated through high-k last process of a gate last process preferably includes an interfacial layer 52 or gate dielectric layer (not shown), a U-shaped high-k dielectric layer 54, a U-shaped work function metal layer 56, and a low resistance metal layer 58.

In this embodiment, the high-k dielectric layer 54 is preferably selected from dielectric materials having dielectric constant (k value) larger than 4. For instance, the high-k dielectric layer 54 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 56 is formed for tuning the work function of the metal gate in accordance with the conductivity of the device. For an NMOS transistor, the work function metal layer 56 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 56 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 56 and the low resistance metal layer 58, in which the material of the barrier layer may include titanium (Ti), titanium nitride (TiN), tantalum (Ta) or tantalum nitride (TaN). Furthermore, the material of the low-resistance metal layer 58 may include copper (Cu), aluminum (Al), titanium aluminum (TiAl), cobalt tungsten phosphide (CoWP) or any combination thereof.

Next, it would be desirable to follow the aforementioned embodiments by removing part of the first ILD layer 36 adjacent to the MOS transistor 20 to form a trench 38 exposing the surface of the substrate 12, forming a trap rich structure 40 in the trench 38, forming a second ILD layer 44 on the first ILD layer 36, the MOS transistors 16, 18, 20, and the trap rich structure 40, and then forming contact plugs 46 in the first ILD layer 36 and the second ILD layer 44 to electrically connect the MOS transistors 16, 18, 20.

It should be noted that since the top surface of the metal gates are even with the top surface of the first ILD layer 36 as polysilicon gates are transformed into metal gates, the top surface of the trap rich structure 40 formed afterwards is not only even with the top surface of the first ILD layer 36 but also even with the top surface of the gate structures 22 made of metal gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a metal-oxide semiconductor (MOS) transistor on a substrate;
   forming a first interlayer dielectric (ILD) layer on the MOS transistor;
   removing part of the first ILD layer to form a trench adjacent to the MOS transistor, wherein the trench exposes a surface of the substrate; and
   depositing a dielectric layer in the trench to form a trap rich structure in the trench, wherein a bottom surface of the trap rich structure is even with a top surface of the substrate, a width of the trap rich structure is greater than a width of the MOS transistor, and the trap rich structure comprises undoped polysilicon or silicon nitride.

2. The method of claim 1, further comprising:
   forming a second ILD layer on the MOS transistor and the trap rich structure;
   forming a contact plug in the first ILD layer and the second ILD layer and electrically connected to the MOS transistor; and
   forming a metal interconnection on the second ILD layer and electrically connected to the contact plug.

3. The method of claim 2, wherein the metal interconnection is directly on top of the trap rich structure.

4. The method of claim 2, wherein the metal interconnection shields the trap rich structure entirely.

5. The method of claim 2, wherein the first ILD layer and the second ILD layer comprise same material.

6. The method of claim 1, wherein a top surface of the dielectric layer is even with a top surface of the first ILD layer.

7. The method of claim 1, wherein the dielectric layer is U-shaped.

8. The method of claim 1, further comprising implanting dopants into the first ILD layer around the trench to form the trap rich structure.

9. A semiconductor device, comprising:
- a metal-oxide semiconductor (MOS) transistor on a substrate;
- a trap rich structure on the substrate and adjacent to the MOS transistor, wherein a bottom surface of the trap rich structure is even with a top surface of the substrate; and
- an interlayer dielectric (ILD) layer on the MOS transistor and the trap rich structure, wherein the trap rich structure comprises a dielectric layer directly contacting the ILD layer, a width of the dielectric layer directly contacting the ILD layer is greater than a width of the MOS transistor, and the trap rich structure comprises undoped polysilicon or silicon nitride.

10. The semiconductor device of claim 9, wherein the ILD layer comprises:
- a first ILD layer covering the MOS transistor; and
- a second ILD layer on the first ILD layer and covering the trap rich structure.

11. The semiconductor device of claim 10, wherein a top surface of the trap rich structure is even with a top surface of the first ILD layer.

12. The semiconductor device of claim 10, wherein the first ILD layer and the second ILD layer comprise same material.

13. The semiconductor device of claim 10, further comprising:
- a contact plug in the first ILD layer and the second ILD layer and electrically connected to the MOS transistor; and
- a metal interconnection on the second ILD layer and electrically connected to the contact plug.

14. The semiconductor device of claim 13, wherein the metal interconnection is directly on top of the trap rich structure.

15. The semiconductor device of claim 13, wherein the metal interconnection shields the trap rich structure entirely.

16. The semiconductor device of claim 9, wherein the trap rich structure is U-shaped.

* * * * *